United States Patent
Miller et al.

(10) Patent No.: US 8,616,873 B2
(45) Date of Patent: Dec. 31, 2013

(54) MICRO-CONFORMAL TEMPLATES FOR NANOIMPRINT LITHOGRAPHY

(75) Inventors: Michael N. Miller, Austin, TX (US); Frank Y. Xu, Round Rock, TX (US); Nicholas A. Stacey, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 180 days.

(21) Appl. No.: 13/014,354

(22) Filed: Jan. 26, 2011

(65) Prior Publication Data

US 2011/0183027 A1    Jul. 28, 2011

Related U.S. Application Data

(60) Provisional application No. 61/298,234, filed on Jan. 26, 2010.

(51) Int. Cl.
| | |
|---|---|
| *B28B 7/36* | (2006.01) |
| *B29C 59/00* | (2006.01) |
| *B29C 59/16* | (2006.01) |
| *B29C 33/38* | (2006.01) |

(52) U.S. Cl.
USPC ........... 425/385; 264/293; 264/241; 264/494; 264/496; 264/446; 264/447; 264/491; 977/887

(58) Field of Classification Search
USPC ........... 977/887; 425/385; 264/293, 241, 494, 264/496, 446, 447, 491
See application file for complete search history.

(56) References Cited

U.S. PATENT DOCUMENTS

| | | |
|---|---|---|
| 5,028,511 A | 7/1991 | Choi |
| 5,395,954 A | 3/1995 | Soria et al. |
| 5,620,777 A | 4/1997 | Goto et al. |
| 5,753,781 A | 5/1998 | Oxman et al. |
| 5,792,550 A | 8/1998 | Phillips et al. |

(Continued)

FOREIGN PATENT DOCUMENTS

| | | |
|---|---|---|
| EP | 2221664 A1 | 8/2010 |
| KR | 2007031858 A | 3/2007 |

(Continued)

OTHER PUBLICATIONS

Chen et al., "Effect of Trimethylsilylation on the Film Stress of Mesoporous Silica Ultralow-k Film Stacks," Electrochem. Solid-State Lett., 9:6 (2006) G215-G218.

(Continued)

*Primary Examiner* — Joseph S Del Sole
*Assistant Examiner* — Lawrence D Hohenbrink, Jr.
(74) *Attorney, Agent, or Firm* — Heather L. Flanagan; Fish & Richardson P.C.; Cameron A. King

(57) ABSTRACT

A micro-conformal nanoimprint lithography template includes a backing layer and a nanopatterned layer adhered to the backing layer. The elastic modulus of the backing layer exceeds the elastic modulus of the nanopatterned layer. The micro-conformal nanoimprint lithography template can be used to form a patterned layer from an imprint resist on a substrate, the substrate having a micron-scale defect, such that an excluded distance from an exterior surface of the micron-scale defect to the patterned layer formed by the nanoimprint lithography template is less than a height of the defect. The nanoimprint lithography template can be used to form multiple imprints with no reduction in feature fidelity.

20 Claims, 11 Drawing Sheets

(56) References Cited

U.S. PATENT DOCUMENTS

| | | |
|---|---|---|
| 5,895,263 A | 4/1999 | Carter et al. |
| 5,928,767 A | 7/1999 | Gebhardt et al. |
| 6,200,736 B1 | 3/2001 | Tan |
| 6,329,017 B1 | 12/2001 | Liu et al. |
| 6,334,960 B1 | 1/2002 | Willson et al. |
| 6,435,948 B1 | 8/2002 | Molnar |
| 6,465,365 B1 | 10/2002 | Annapragada |
| 6,483,174 B1 | 11/2002 | Crafts et al. |
| 6,497,961 B2 | 12/2002 | Kang et al. |
| 6,573,131 B2 | 6/2003 | Yan et al. |
| 6,592,764 B1 | 7/2003 | Stucky et al. |
| 6,660,245 B1 | 12/2003 | Gaynor et al. |
| 6,790,790 B1 | 9/2004 | Lyons et al. |
| 6,873,087 B1 | 3/2005 | Choi et al. |
| 6,932,934 B2 | 8/2005 | Choi et al. |
| 6,936,194 B2 | 8/2005 | Watts |
| 6,957,608 B1 | 10/2005 | Hubert et al. |
| 6,960,327 B2 | 11/2005 | Navrotsky et al. |
| 7,077,992 B2 | 7/2006 | Sreenivasan et al. |
| 7,090,716 B2 | 8/2006 | McMackin et al. |
| 7,138,362 B2 | 11/2006 | Abe et al. |
| 7,141,188 B2 | 11/2006 | Li et al. |
| 7,157,036 B2 | 1/2007 | Choi et al. |
| 7,160,949 B2 | 1/2007 | Ota et al. |
| 7,179,396 B2 | 2/2007 | Sreenivasan |
| 7,253,130 B2 | 8/2007 | Chiang et al. |
| 7,303,989 B2 | 12/2007 | Boyanov et al. |
| 7,307,118 B2 | 12/2007 | Xu et al. |
| 7,314,792 B2 | 1/2008 | Kim et al. |
| 7,365,375 B2 | 4/2008 | Goodner et al. |
| 7,384,622 B2 | 6/2008 | Hata et al. |
| 7,396,475 B2 | 7/2008 | Sreenivasan |
| 7,405,459 B2 | 7/2008 | Ogihara et al. |
| 7,422,774 B2 | 9/2008 | Zheng et al. |
| 7,422,776 B2 | 9/2008 | Yim et al. |
| 2003/0054115 A1 | 3/2003 | Albano et al. |
| 2003/0127002 A1 | 7/2003 | Hougham et al. |
| 2004/0065252 A1 | 4/2004 | Sreenivasan et al. |
| 2004/0065976 A1 | 4/2004 | Sreenivasan et al. |
| 2004/0124566 A1 | 7/2004 | Sreenivasan et al. |
| 2004/0188381 A1 | 9/2004 | Sreenivasan |
| 2004/0211754 A1 | 10/2004 | Sreenivasan |
| 2005/0100830 A1 | 5/2005 | Xu et al. |
| 2005/0187339 A1 | 8/2005 | Xu et al. |
| 2005/0192421 A1* | 9/2005 | Xu et al. .................. 528/23 |
| 2005/0238967 A1 | 10/2005 | Rogers et al. |
| 2006/0024976 A1 | 2/2006 | Waldfried et al. |
| 2006/0081557 A1 | 4/2006 | Xu et al. |
| 2007/0117408 A1 | 5/2007 | Nguyen et al. |
| 2007/0123059 A1 | 5/2007 | Haverty et al. |
| 2007/0160639 A1 | 7/2007 | Pantelidis et al. |
| 2007/0190777 A1 | 8/2007 | Jiang et al. |
| 2008/0000373 A1 | 1/2008 | Petrucci et al. |
| 2008/0055581 A1 | 3/2008 | Rogers et al. |
| 2008/0061214 A1* | 3/2008 | Lee et al. .................. 249/112 |
| 2008/0143015 A1 | 6/2008 | Lee et al. |
| 2008/0160129 A1 | 7/2008 | Resnick et al. |
| 2008/0197503 A1 | 8/2008 | Hsu |
| 2008/0199632 A1 | 8/2008 | Wolden et al. |
| 2009/0140458 A1 | 6/2009 | Xu et al. |
| 2009/0266418 A1 | 10/2009 | Hu et al. |
| 2010/0072671 A1 | 3/2010 | Schmid et al. |
| 2010/0084376 A1* | 4/2010 | Khusnatdinov et al. ........ 216/39 |
| 2010/0104852 A1 | 4/2010 | Fletcher et al. |
| 2010/0108639 A1 | 5/2010 | Kasono |
| 2010/0109201 A1 | 5/2010 | Fletcher et al. |
| 2010/0109203 A1* | 5/2010 | Chen et al. ............... 264/446 |
| 2011/0189329 A1 | 8/2011 | Miller et al. |

FOREIGN PATENT DOCUMENTS

| | | |
|---|---|---|
| WO | WO/97/06012 | 2/1997 |
| WO | WO0002090 | 1/2000 |
| WO | WO0002090 | 4/2000 |
| WO | WO2005036681 | 1/2005 |
| WO | WO2005036681 | 4/2005 |
| WO | W02006044690 A3 | 8/2006 |
| WO | WO2008053418 | 5/2008 |
| WO | WO/2008/126313 | 10/2008 |
| WO | W02009067241 A1 | 5/2009 |
| WO | W02010047821 A1 | 4/2010 |
| WO | WO/2011/004991 | 1/2011 |

OTHER PUBLICATIONS

Breck, Zeolite Molecular Sieves: Structure, Chemistry, and Use; John Wiley and Sons, New York, New York, 1974 (p. 637).

Shackelford, "Gas solubility in glasses—principles and structural implications," J. Non-Cryst. Solids 253 (1999) 231-241.

Boiko, "Migration Paths of Helium in $\alpha$-Quartz and Vitreous Silica from Molecular Dynamics Data," Glass Physics and Chemistry, 29:1 (2003) 42-48.

Zhang et al., "Highly Porous Polyhedral Silsesquixoane Polymers. Synthesis and Characterization," J. Am. Chem. Soc., 120 (1998) 8380-8391.

Peng et al., "Analysis of the gas transport performance through PDMS/PS composite membranes using the resistances-in-series model," J. Membrane Sci. 222 (2003) 225-234.

Prakash et al., "Small volume PCR in PDMS biochips with integrated fluid control and vapor barrier," Sensors and Actuators B 113 (2006) 398-409.

Yoda et al., "Properties of High-Performance Porous SiOC Low-k Film Fabricated Using Electron-Beam Curing" Jpn. J. Appl. Phys. 44 (2005) 3872-3878.

Kulkarni et al., "Electrical and structural characteristics of chromium thin films deposited on glass and alumina substrates," Thin Solid Films 301 (1977): 17-22.

Mitra et al., "Synthesis and evaluation of pure-silica-zeolite BEA as low dielectric constant material for microprocessors," Ind. Eng. Chem. Res., 43:12 (2004) 2946-2949.

Bushan et al., "Friction and wear studies of silicon in sliding contact with thin film magnetic rigid disks," J. Mater. Res. 9 (1993) 1611-1628.

Li et al., "Mechanical Characterization of micro/nanoscale structures for MEMS/NEMS applications using nanoindentation techniques," Ultramicroscopy 97 (2003)481-494.

Devine et al., "On the structure of low-temperature PECVD silicon dioxide films," J. Electron. Mater. 19 (1990) 1299-1301.

Cao et al., "Density change and viscous flow during structural relaxation of plasma-enhanced chemical-vapor-deposited silicon oxide films," J. Appl. Phys. 96 (2004) 4273-4280.

Xia et al., "Sub-10-nm Self-Enclosed Self-Limited Nanofluidic Channel Arrays," Nano. Lett. 8:11 (2008) 3830-3833.

Johnson et al. "Effect of calcination and polycrystallization on mechanical properties of nanoporous MFI zeolites," Materials Science and Engineering A 456(2007) 58-63.

Dong et al. "Template-removal-associated microstructural development of porous-ceramic-supported MFI zeolite membranes," Microporous and Mesoporous Materials 34 (2000) 241-253.

Tang et al., "Microwave synthesis of MFI-type zeolite membranes by seeded secondary growth without the use of organic structure directing agents," Microporous and Mesoporous Materials 118:1-3 (2009) 224-231.

Thoma et al., "Vapor phase transport synthesis of zeolites from sol-gel precursors," Microporous and Mesoporous Materials 41 (2000) 295-305.

McLeary et al., "Zeolite-based films, membranes, and membrane reactors: progress and prospects," Microporous and Mesoporous Materials 90 (2006) 198-200.

Motuzas et al., "Ultra-rapid production of MFI membranes by coupling microwave-assisted synthesis with either ozone or calcination treatment," Microporous and Mesoporous Materials, 99:1-2 (2007) 197-205.

Kanezashi et al., "Template-free synthesis of MFI-type zeolite membranes: Permeation characteristics and thermal stability improvement of membrane structure," Journal of Membrane Science, 286: 1-2 (2006) 213-222.

(56) References Cited

OTHER PUBLICATIONS

Li et al., "Microwave synthesis of zeolite membranes: A review," Journal of Membrane Science, 316:1-2 (2008) 3-17.
Gualtieri et al., "The influence of heating rate on template removal in silicalite-1: An in-situ HT-XRPD study," Microporous and Mesoporous Materials 89:1-3 (2006) 1-8.
Li et al., "Effects of crystallinity in spin-on pure-silica-zeolite MFI low-dielectric-constant films," Advanced Functional Materials. 14:10 (2004) 1019-1024.
Golden et al., "Designing Porous low-k Dielectrics," Semiconductor International, May 2001.
Levy et al., "A comparative study of plasma enhanced chemically vapor deposited Si-O-H and Si-N-C-H films using the environmentally benign precursor diethylsilane," Mater. Lett. 54 (2002) 1299-1301.
Stoney, "The tension of metallic films deposited by electrolysis," Proc. R. Soc. London, Ser. A 82 (1909) 172.
Padovani et al., "Chemically bonded porogens in methylsilsesquioxane: I. Structure and bonding," Journal of the Electrochemical Society, 149 (12) F161-F170 (2002).
Wolf et al., "Silicon Processing for the VLSI Era, vol. 1—Process Technology," pp. 407-413, Jan. 1, 1986.
Pham et al., "Direct Spray Coating of Photoresist," The 16th European Conference on Solid State Transducers, Sep. 16-18, 2002, Czech Republic.
PCT, International Search Report and Written Opinion for Application No. PCT/US05/37063 dated Jun. 14, 2006, 10 pages. (WO 2006/044690).
European, International Search Report and Written Opinion for Application No. PCT/US09/005775 dated Apr. 8, 2010, 12 pages. (WO 2010/047821).
Kim et al., "Fabrication of three-dimensional microstructures by soft molding," Appl. Phys. Lett., vol. 79, No. 14, Oct. 1, 2001, pp. 2285-2287.
Zhichao Song, "Study of demolding process in thermal imprint lithography via numerical simulation and experimental approaches," A Thesis submitted to graduate faculty of the Louisiana State University and Agricultural and Mechanical College in partial fulfillment of the requirements for the degree of Master of Science in Mechanical Engineering in the Department of Mechanical Engineering, Dec. 2007, 132 pages.
PCT, International Search Report and Written Opinion for Application No. PCT/US08/12990 dated Feb. 25, 2009, 7 pages. (WO2009/067241).
Dupont Zonyl UR, www.dupont.com/zonyl/pdf/UR.pdf; pp. 1-2, Jun. 21, 2003.
Parsettensite mineral data, www.webmineral.com/data/parsettensite.shtml; pp. 1-5, Aug. 17, 2001.
European, International Search Report and Written Opinion for Application No. PCT/US2011/023193 dated Aug. 19, 2011, 4 pages.
Yoo et al. Unconventional Patterning with a Modulus-Tunable Mold: From Imprinting to Microcontact Printing; Chem Mater. 2004-16; pp. 5000-5005. Nov. 6, 2004.
Xia et al. Soft Lithography, Angew. Chem. Int. Ed., ISSN 1433-7851; vol. 37 pp. 550-575; Jan. 1, 1998.
International Search Report for Application No. PCT/US2011/022583, Aug. 10, 2011.
Dupont Tenjin Films, Melinex 561 Datasheet, http://www.dupont-teijinfilms.com/FilmEnterprise/Datasheet.asp?ID=130&Version=US retrieved from Internet Dec. 3, 2012, 1 page.

\* cited by examiner

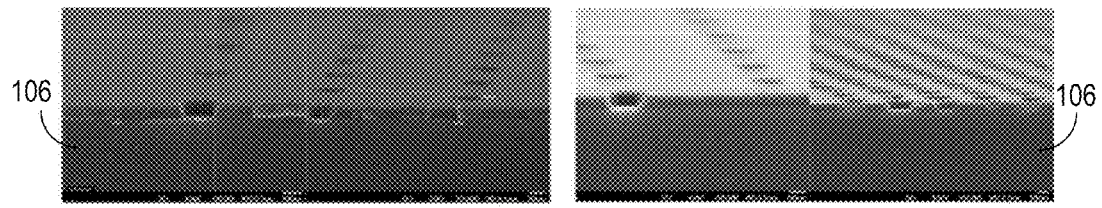
*FIG. 9A*      *FIG. 9B*
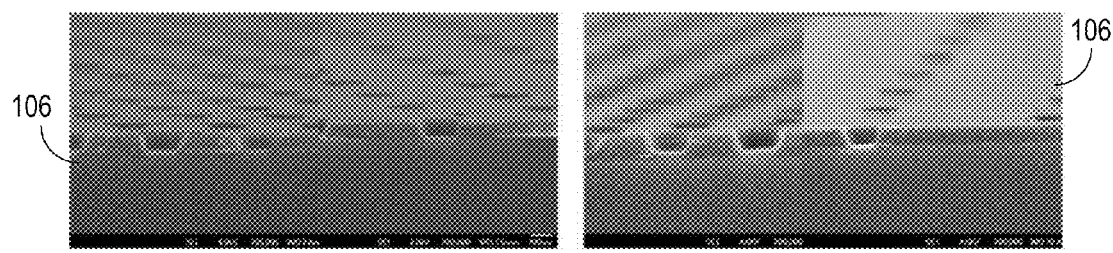
*FIG. 9C*      *FIG. 9D*
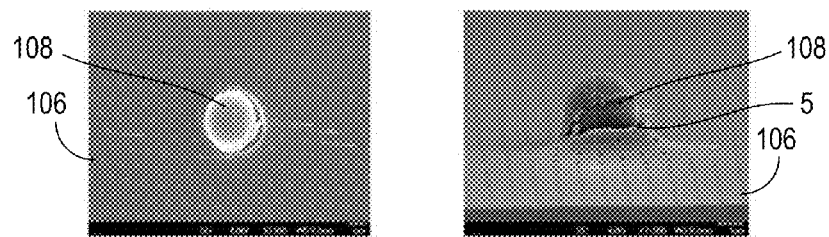
*FIG. 10A*      *FIG. 10B*
*FIG. 10C*      *FIG. 10D*      *FIG. 10E*

MICRO-CONFORMAL TEMPLATES FOR NANOIMPRINT LITHOGRAPHY

CROSS-REFERENCE TO RELATED APPLICATION

This application claims priority to U.S. Application Ser. No. 61/298,234 filed Jan. 26, 2010, which is incorporated by reference herein in its entirety.

TECHNICAL FIELD

The present invention relates to micro-conformal templates for nanoimprint lithography.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Application Publication No. 2004/0065976, U.S. Patent Application Publication No. 2004/0065252, and U.S. Pat. No. 6,936,194, all of which are hereby incorporated by reference herein.

An imprint lithography technique disclosed in each of the aforementioned U.S. patent application publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and the formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. This technique may be applied to create multiple copies, or daughter templates, of a single original, or "master" template.

Substrate surface defects and particles positioned between the substrate and the template can limit the effectiveness of pattern transfer in nanoimprinting processes. FIG. 1 illustrates damage 2 of a mold or template 18 formed from a rigid material and exclusion of polymerizable material 34 from volume 4 when a particle 6 is positioned between the template and the surface of the substrate 12. In some cases, lack of contact between the template and the substrate during imprinting (e.g., caused by surface defects on the substrate) may yield excluded regions in the imprint and/or regions of thick residual layer. The excluded distance 5 can be measured as a distance from particle 6 to the polymerizable material 34. Some surface defects may result in imperfections that are repeated across multiple imprint cycles.

As illustrated in FIG. 1, templates formed from hard or rigid materials (e.g., glass or silicon) may be unable to conform to small (e.g., sub-micron) particles, due at least in part to the high elastic modulus of the template material and the spatial conformality related to modulus and thickness of the template. In some cases, the presence of a particle 6 (e.g., a sub-micron particle) can cause printing volume exclusions 4 on the order of cubic millimeters. In other cases, a substrate with a high surface roughness (e.g., a high spatial frequency of low-amplitude defects) can create filling problems associated with conforming difficulty for a nanoimprint template 18.

Various methods have been described to generate "soft templates" or nanoimprint templates that employ a single soft material to conform to particles on a substrate or to address surface topography of a substrate. In some cases, use of a single layer of an elastomeric or thin plastic material with a low elastic modulus (e.g., poly(dimethylsiloxane) (PDMS) with an elastic modulus of about 1 MPa) as a template can result in roof collapse, lateral collapse, and/or rounding of features in the resulting patterned layer by surface tension. Roof collapse can occur when the patterned surface of the template has a wide and shallow relief pattern. Lateral collapse can occur when closely spaced, narrow features collapse laterally during imprinting due to the low modulus of the patterned surface of the template. Surface tension-related deformation can occur in elastomeric patterned layers and is related to the rounding of sharp corners due to surface tension after the patterned surface is released from the template.

Other methods include the use of two-layer templates and low elastic modulus single-use polymeric templates. These methods, however, can also yield patterned layer subject roof collapse, lateral collapse, and/or surface tension related deformation, and can sometimes require multi-step fabrication processes and temperature-controlled molding and/or demolding processes. For example, use of a single polymeric material as a disposable nanoimprint template may require two imprint steps for each imprinted substrate, including forming the template and imprinting on the substrate. Temperature-controlled molding and/or demolding may be used, for example, when curing occurs by methods other than ultraviolet irradiation.

Even with the use of a thin plastic template (elastic modulus >1 GPa) or a thin glass template (elastic modulus >70 GPa) separately or as part of a multilayer template, a desired level of conformality may not be achieved over a substrate with severe topography. Severe topography, such as an elevation change of hundreds of nanometers over a distance of hundreds of microns, has been observed for substrates such as polycrystalline and ultrathin silicon solar substrates. While softer elastomeric materials (e.g., PDMS, with an elastic modulus between about 100 kPa and about 3 MPa) may be able to achieve surface contact with a rough substrate, the resulting patterned layer may demonstrate feature distortion and/or pattern fidelity limits.

SUMMARY

In one aspect, a micro-conformal nanoimprint lithography template includes a backing layer and a nanopatterned layer adhered to the backing layer. The elastic modulus of the backing layer exceeds the elastic modulus of the nanopatterned layer. The micro-conformal nanoimprint lithography template can be used to form a patterned layer from an imprint resist on a substrate, the substrate having a micron-scale defect, such that an excluded distance from the micron-scale defect to the patterned layer formed by the nanoimprint lithography template is less than a height of the defect. The nanoimprint lithography template can be used to form multiple imprints with no reduction in feature fidelity.

In another aspect, a nanoimprint lithography template includes a backing layer, a silicon-containing nanopatterned layer adhered to the backing layer, and an oxidized layer on the surface of the silicon-containing nanopatterned layer. The elastic modulus of the oxidized layer exceeds the elastic modulus of the silicon-containing layer, and a thickness of the oxidized layer is at least 5 nm.

In yet another aspect, a nanoimprint lithography method includes selecting a backing layer, disposing a silicon-containing polymerizable material on the backing layer, and contacting the silicon-containing polymerizable material with a patterned master nanoimprint lithography template. The silicon-containing polymerizable material is solidified to form a silicon-containing patterned layer adhered to the backing layer, and the master nanoimprint template is separated from the silicon-containing patterned layer. The surface of the silicon-containing patterned layer is oxidized to form an oxidized layer with a thickness of at least 5 nm on the surface of the silicon-containing patterned layer.

In certain implementations, the oxidized layer is formed by an oxidizing treatment. For example, the oxidizing treatment can include oxygen plasma processing, oxygen ashing, reactive ion etching, UV-ozone treatment, or a combination thereof. A thickness of the oxidized layer can be between about 5 nm and about 50 nm, or between about 10 nm and about 30 nm.

In some cases, a silicon content of the silicon-containing nanopatterned layer is at least about 10 wt %. The silicon-containing nanopatterned layer can include an inorganic-organic hybrid polymer. The silicon-containing nanopatterned layer can be formed from a composition including a surfactant, such as a fluorinated surfactant, an ionic surfactant, a non-ionic surfactant, or a combination thereof. The elastic modulus of the backing layer can be greater than the elastic modulus of the silicon-containing nanopatterned layer. In some cases, the elastic modulus of the oxidized layer is greater than the elastic modulus of the nanopatterned layer. In some cases, the elastic modulus of the silicon-containing nanopatterned layer is greater than the elastic modulus of polydimethylsiloxane.

In some implementations, the nanoimprint lithography template is operable to form multiple imprints (e.g., over 100 or over 200) with no reduction in feature fidelity. In certain implementations, the nanoimprint lithography template is operable to form a patterned layer in an imprint resist on a substrate having a micron-scale defect, such that an excluded distance from an exterior surface of the micron-scale defect to the patterned layer formed by the nanoimprint lithography template is less than a height of the defect.

As described herein, micro-conformal nanoimprint templates demonstrate longevity, feature fidelity, UV transparence, and are substantially conformable to surface topography, including surface defects and particles positioned between the substrate and the mold. Materials used to form the micro-conformal templates can be dispensed as a droplet or series of droplets on an automated nanoimprint tool and processed at room temperature to allow for rapid production of compliant template replicas with low material usage and ease of processing.

Aspects and implementations described herein may be combined in ways other than described above. Other aspects, features, and advantages will be apparent from the following detailed description, the drawings, and the claims.

BRIEF DESCRIPTION OF THE DRAWINGS

FIGS. 9A-9D show SEM images of imprints made with a multilayer UV imprint replicated micro-conformal template.

FIGS. 10A-10E show SEM images of imprints formed with a micro-conformal nanoimprint lithography template.

DETAILED DESCRIPTION

Figure 1:
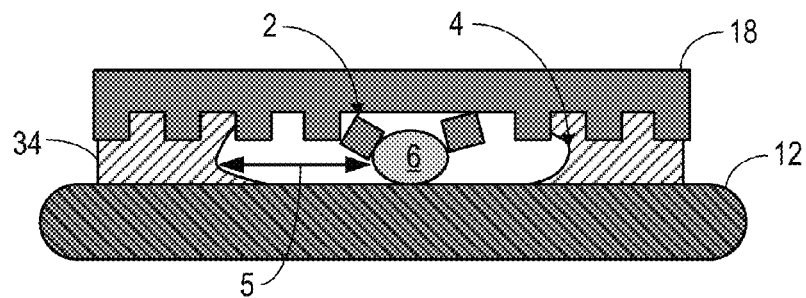
FIG. 1 illustrates damage to a rigid mold and an excluded volume associated with a particle positioned between a substrate and the mold.
Figure 2:
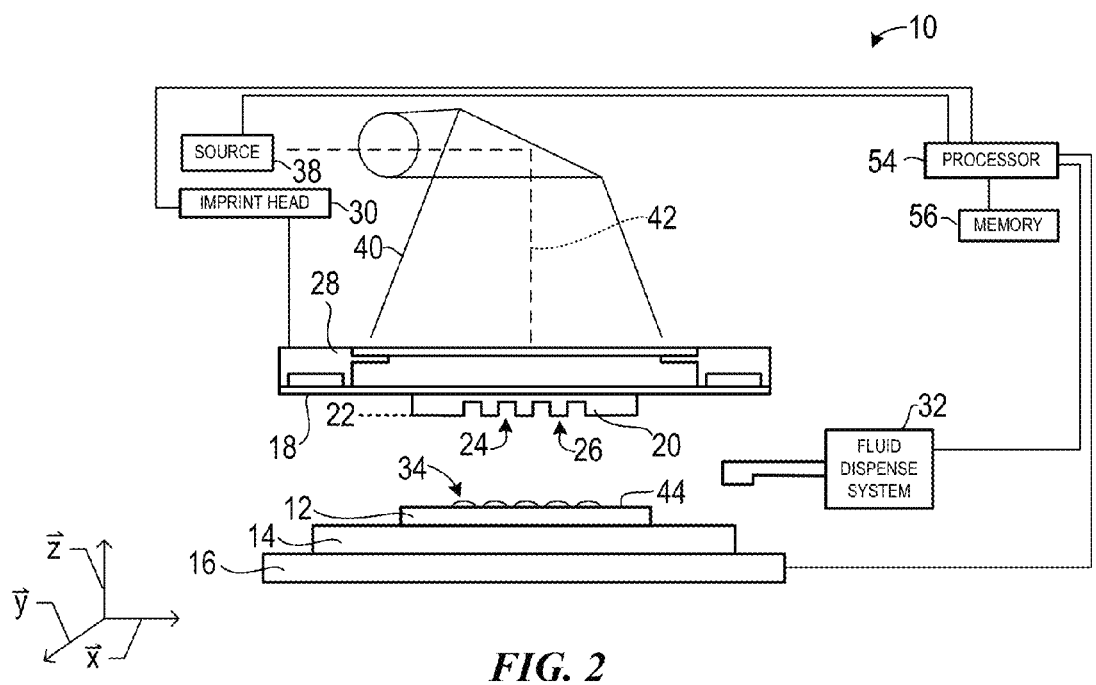
FIG. 2 illustrates a simplified side view of a lithographic system.

Referring to FIG. 2, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 generally includes a rectangular or square mesa 20, with dimensions up to about 150 microns, and extending about 10 microns to about 50 microns, or about 15 microns to about 20 microns from a surface of the template towards substrate 12. A surface of mesa 20 may include patterning surface 22. In some cases, mesa 20 is referred to as mold 20. Template 18 and/or mold 20 may be formed from such materials including, but not limited to, fused silica, quartz, silicon, silicon nitride, organic polymers, siloxane polymers, borosilicate glass, fluorocarbon polymers, metal (e.g. chrome, tantalum), hardened sapphire, or the like, or a combination thereof. In some cases, template 18 and/or mold 20 is a micro-conformal template as described herein. As illustrated, patterning surface 22 comprises features defined by a plurality of spaced-apart recesses 24 and/or protrusions 26, though embodiments are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and U.S. Patent Application Publication No. 2005/0187339, both of which are incorporated by reference herein.

Figure 3:
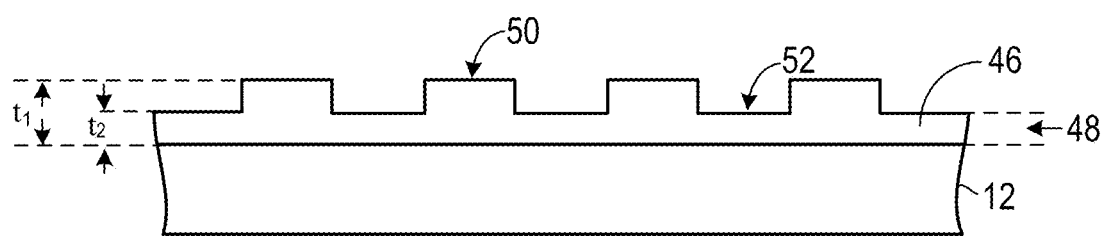
FIG. 3 illustrates a simplified side view of the substrate shown in FIG. 2 having a patterned layer positioned thereon.

Referring to FIGS. 2 and 3, system 10 may further include an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may include a residual layer 48 and a plurality of features shown as protrusions 50 and recessions 52, with protrusions 50 having a thickness t1 and residual layer 48 having a thickness t2.

The above-described system and process may be further implemented in imprint lithography processes and systems referred to in U.S. Pat. Nos. 6,932,934; 7,077,992; 7,179,396; and 7,396,475, each of which is incorporated by reference herein.

Figure 4:
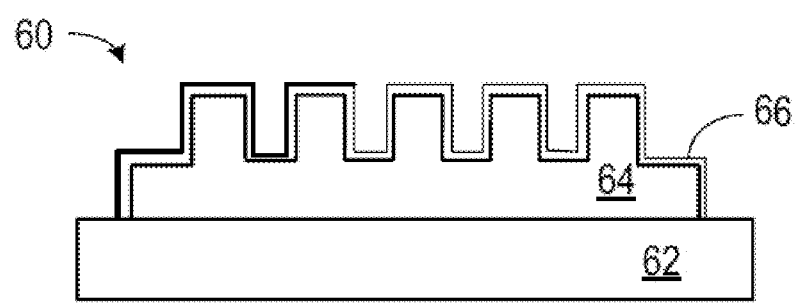
FIG. 4 illustrates a side view of a micro-conformal template for nanoimprint lithography.

FIG. 4 shows an embodiment of a micro-conformal nanoimprint template. Micro-conformal nanoimprint template 60 is a multi-layer template including backing layer 62 and patterned layer 64. Patterned layer 64 is formed from functional imprint material. Oxidized layer 66 is formed on the surface of patterned layer 64. The backing layer material and the functional imprint material may be selected to achieve the desired spatial conformality of the template.

As used herein, a "micro-conformal" template refers to a nanoimprint template that can conform over a micron-scale defect on the substrate (e.g., a particle, ridge, or surface perturbation on the order of microns to tens of microns in diameter and up to 100 µm), such that an excluded distance (e.g., a maximum excluded distance) from the micron-scale defect to a patterned layer formed by the nanoimprint lithography template is less than a height of the defect from the projected boundary of the micron-scale defect on the substrate. The height of the defect above the substrate is understood be the longest perpendicular distance from the imprinting surface of the substrate to an exterior surface of the defect. The projected boundary is understood to be the outline of a perpendicular projection of the micron-scale defect onto the substrate (i.e., the smallest possible projected area). The excluded distance can be thought of as a measure of the void proximate the micron-scale defect.

In one example, the height of a spherical particle on the surface of the substrate is the diameter of the particle. The projected area of the spherical particle is a circle with a diameter equal to the diameter of the sphere. The excluded distance (e.g., the maximum excluded distance) from the spherical particle on a substrate over which a patterned layer has been formed, to the patterned layer, is less than a diameter of the particle from the projected circle on the substrate. In another example, the height of a cylindrical rod resting on a circular base is the length of the cylinder. The projected area is a circle with the diameter of the cylinder. The excluded distance (e.g., the maximum excluded distance) from the cylinder on a substrate over which a patterned layer has been formed, to the patterned layer, is less than the length of the cylinder from the projected circle on the substrate. In this case, the area of the projected circle is the same as the circular cross-sectional area of the cylinder.

Imprinting over micron-scale particles generally does not cause irreversible damage to the micro-conformal template. Rather, the area of the defect region in imprints on subsequent substrates decreases, showing recovery of the micro-conformal template. In some cases, a micro-conformal template shows no reduction in feature fidelity multiple imprints (e.g., after 100, 200, or more imprints). In addition, residual layer thickness of imprints formed with the micro-conformal templates described herein is generally uniform, with a thickness of less than about 50 nm, less than about 25 nm, or less than about 15 nm.

Micro-conformal templates can exhibit improved conforming behavior over a standard glass or silicon template when printing over surface particles or topography when used for nanoimprint patterning. As used herein, "functional imprint material" refers to material that is used to form patterned features of a micro-conformal template. In some cases, functional imprint material is used to form a single layer micro-conformal template. In other cases, functional imprint material is used to form one or more layers of a multilayer micro-conformal template. In the embodiment shown in FIG. 4, for example, functional imprint material used to form mold 64 is a silicon-containing resist. The silicon-containing resist can be a UV-curable resist with a high silicon content. As used herein, a "high silicon content" refers to a silicon content greater than about 10 wt %.

Figure 5:
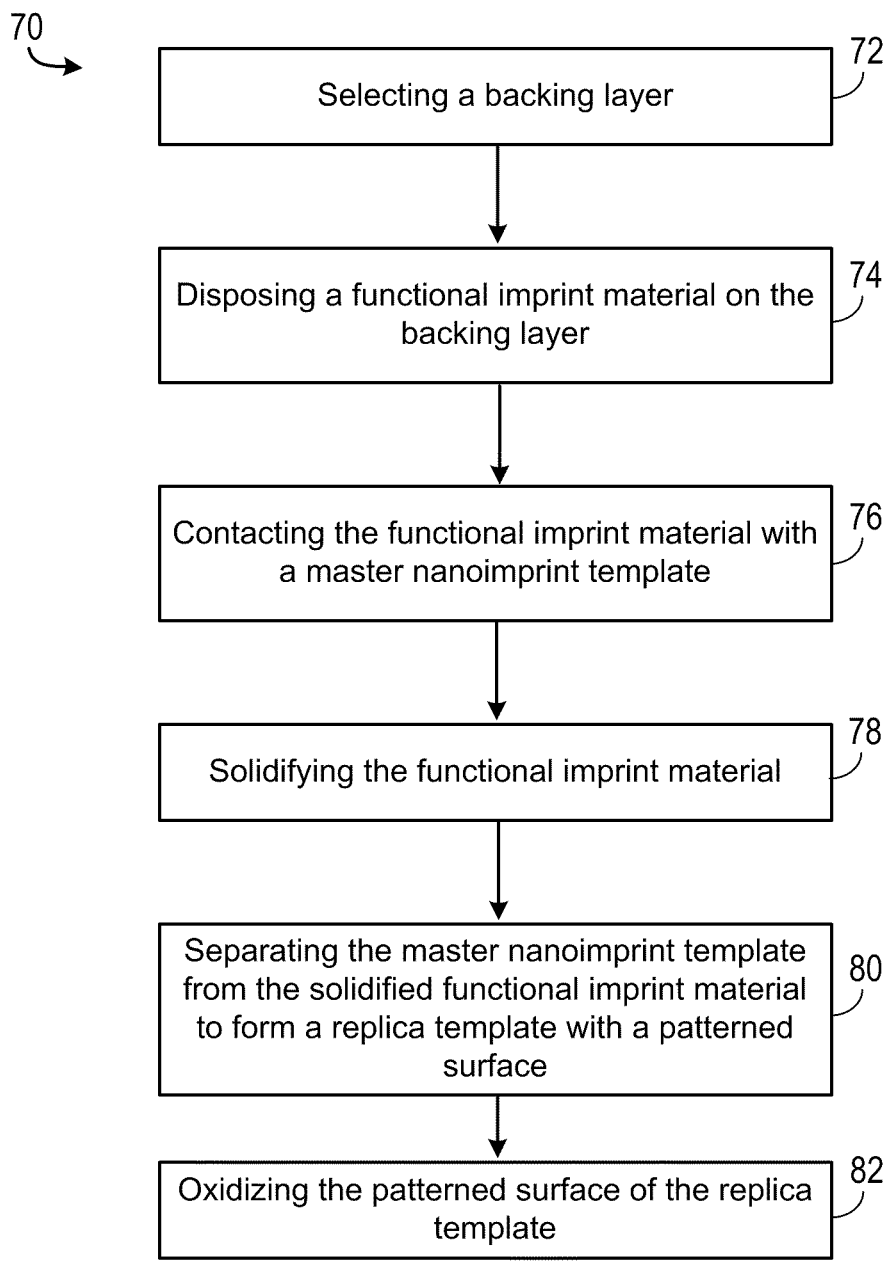
FIG. 5 is a flow chart showing a process for forming a micro-conformal template for nanoimprint lithography.

Referring to FIG. 5, micro-conformal nanoimprint template 60 may be formed by process 70. Process 70 includes selecting a backing layer 72, coating at least a portion of the backing layer with a silicon-containing material 74, and contacting the silicon-containing material with a master nanoimprint template 76. In some cases, the silicon-containing material includes a surfactant (e.g., a fluorinated surfactant, an ionic surfactant, a non-ionic surfactant). The silicon-containing material is solidified (e.g., cured) 78, and the master nanoimprint template is separated from the solidified material or replica template 80. After separation of the master nanoimprint template from the replica template, the patterned surface of the solidified replica template is oxidized 82.

A thickness of backing layer 62 may contribute to spatial conformality of the template 60. For example, a template with a thinner backing layer may demonstrate greater defect tolerance than a similar template with a thicker backing layer. An elastic modulus of the backing layer material also affects the defect tolerance of the template.

Figure 6:
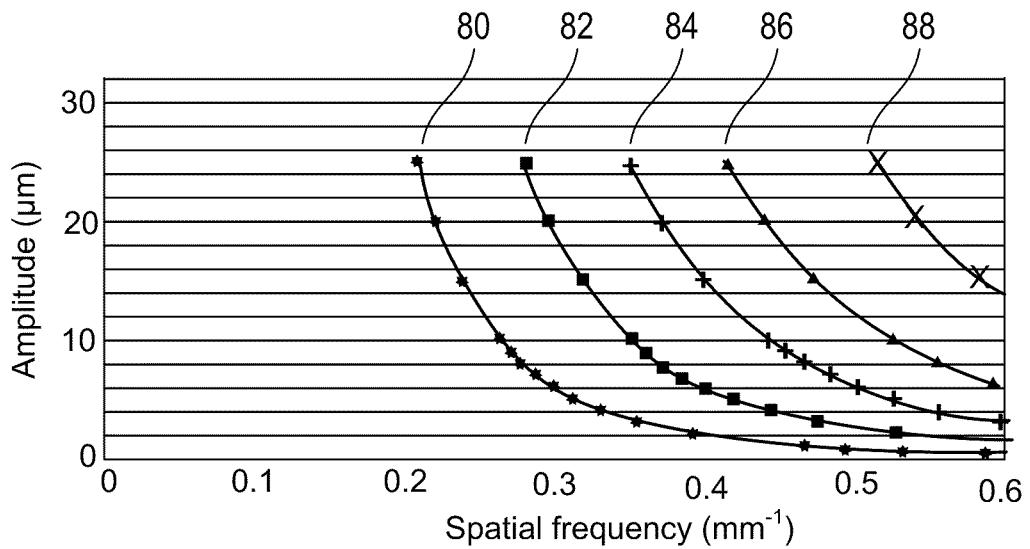
FIG. 6 is a plot of amplitude versus spatial frequency showing mechanical modeling of bending characteristics of different thicknesses of a material with an elastic modulus of about 3 GPa.
Figure 7:
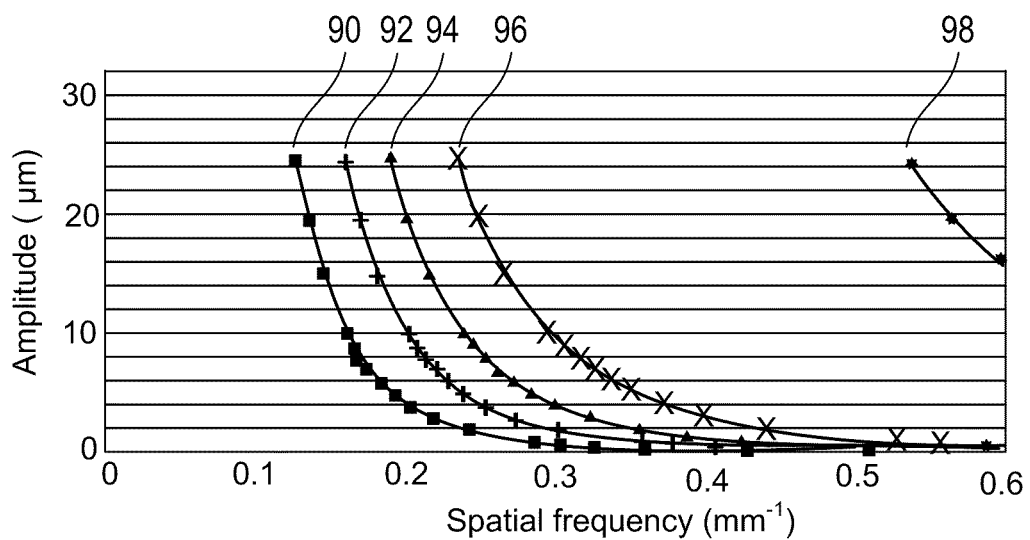
FIG. 7 is a plot of amplitude versus spatial frequency showing mechanical modeling of bending characteristics of different thicknesses of a material with an elastic modulus of about 70 GPa.

FIGS. 6 and 7 show results from mechanical modeling of bending behavior of template backing layers formed from materials with an elastic modulus of about 3 GPa (e.g., polymethyl methacrylate, polycarbonate, acrylic, and the like) and about 70 GPa (e.g., fused silica), respectively, for defects of a certain amplitude as a function of spatial frequency of the defects. In FIGS. 6 and 7, conformality of a template with a backing layer of the thickness indicated by a particular curve to surface defects of a given amplitude (y axis) and spatial frequency (x axis) may be determined based upon the position of the surface defect with respect to the particular curve. A backing layer of the thickness denoted by a particular curve can conform successfully to defects that fall into the region to the left of that particular curve, but cannot conform successfully to defects that fall into the region to the right of that particular curve. For successful imprinting with micro-conformal templates over particles with a diameter up to tens of microns, the excluded distance extends from the surface of the particle a distance less than the diameter of the particle.

Plots 80, 82, 84, 86, and 88 in FIG. 6 refer to backing layer thicknesses of 1000 μm, 675 μm, 500 μm, 400 μm, and 300 μm, respectively. Plots 90, 92, 94, 96, and 98 in FIG. 7 refer to backing layer thicknesses of 675 μm, 500 μm, 400 μm, 300 μm, and 100 μm. As seen in FIGS. 6 and 7, thicker backing layers allow better conformality to larger defects spaced more closely together than thinner backing layers. Furthermore, lower elastic modulus backing layers, as modeled in FIG. 6, show better spatial conformality than higher modulus backing layers of the same thickness, as modeled in FIG. 7.

The construction of template 60 is such that it can be fabricated through automated processing with existing equipment and is compatible with high volume nanoimprint tools such as, for example, the IMPRIO 2200 and IMPRIO 1100 (HVM HDD nanoimprint tool available from Molecular Imprints, Inc., Austin, Tex.). When existing equipment is used, the template configuration may match that of a wafer. As such, the backing layer is constructed to simulate a wafer. In the case of the IMPRIO 2200 and IMPRIO 1100, a 150 mm diameter, notched wafer format can be used. To achieve a low elastic modulus backing layer, plastic wafers including, for example, polycarbonate and polymethyl methacrylate (PMMA) may be used. As seen in FIGS. 6 and 7, PMMA and polycarbonate are expected to demonstrate better conforming behavior than fused silica or glass for the same thickness of the wafer or backing layer.

In some cases, a thin layer of higher modulus material may be used as a backing layer. For example, a layer of VF-45 drawn glass with a thickness of about 300 μm or less (available from Schott North America, Inc., Elmsford, N.Y.) may be used as a backing layer. In certain cases, a template may include an elastic deformation layer, for example, between the backing layer and the functional imprint material (i.e., the patterned layer). The backing layer is generally selected such that the elastic modulus of the backing layer exceeds the elastic modulus of a patterned layer adhered to the backing layer. In some cases, the patterned layer has an elastic modulus greater than about 3 MPa or greater than about 5 MPa. That is, in some cases, the patterned layer has higher elastic modulus than PDMS. As such, in some cases, the patterned layer does include PDMS (e.g., the silicon-containing material is free of PDMS).

After selection of the backing layer, at least a portion of the backing layer is coated with a functional imprint material. The functional imprint material may be, for example, a polymerizable silicon-containing material. A silicon content of the silicon-containing material can be at least about 10 wt %. In some cases, the functional imprint material is a high-silicon-content polymerizable material, such as an ORMOCER (available from micro resist technology GmBH, Germany), a high-silicon-content UV-curable acrylate-based nanoimprint resist, such as SILMAT (available from Molecular Imprints, Inc.), or other silicon-containing imprint resist.

ORMOCERs are high-silicon-content inorganic-organic hybrid polymerizable sol gel materials that combine certain properties of silicone (e.g., elasticity), organic polymers (e.g., UV curability), and ceramics (e.g., stability, and optical properties). ORMOCERs include an inorganic backbone and methacrylate and epoxy functional groups, and are cured in a two-step process that includes a UV polymerization of the methacrylate functionality, followed by a thermal polymerization of epoxy groups to yield high silica content, glass-like materials. These materials can be tailored to provide properties suitable for a variety of optics, electronics, and optoelectronics applications.

In some cases, a functional imprint material includes one or more surfactant. The surfactant can facilitate mold release, and can reduce or eliminate defects in patterned layers formed during replication runs. At least one of the surfactants can be a fluorinated surfactant). Examples of suitable fluorinated surfactants include FS2000 (available from DuPont), FC 4432 (available from 3M Company), and the like. Experiments showed that addition of a fluorinated surfactant to a high-silicon-containing material such as an ORMOCER allowed substantially defect-free pattern replication, while imprints made without the fluorinated surfactant resulted in adhesion failures within the imprint.

Surfactant may be added to a silicon-containing resist in an amount between about 0.5 wt % and about 2 wt %. When a low viscosity UV-curable silicon-containing resist (e.g., SILMAT) is used, the surfactant can be added to the resist formulation without any additional solvent. When a higher viscosity material such as an ORMOCER is used, a solvent (e.g., propylene glycol methyl ether acetate (PGMEA) or methyl n-amyl ketone (MAK)) may be added to lower viscosity of the formulation (e.g., to facilitate spin-coating of the resist prior to imprinting). In one example, a formulation includes between about 10 wt % and about 50 wt % ORMOCER resist, between about 0.5 wt % and about 2 wt % fluorinated surfactant, and PGMEA as a solvent.

After the wafer is coated with the functional imprint resist material (e.g., by spin-coating or ink-jet dispensing), the resist material may be imprinted with a master template (e.g., a fused silica template) and cured to form a replica template with a nanopatterned layer adhered to the backing layer. Curing may include, for example, UV curing at room temperature.

After curing of the patterned layer, the master template may be separated from the replica template. In some cases, the patterned layer has an elastic modulus greater than about 3 MPa or greater than about 5 MPa. That is, in some cases, the patterned layer has higher elastic modulus than PDMS. As such, in some cases, the patterned layer may not include PDMS (e.g., the silicon-containing material may be free of PDMS). After separation of the master template from the replica template, the replica template may be subjected to oxidation processing.

Oxidation of the silicon-containing functional imprint material may be achieved, for example, through oxygen plasma processing such as in a reactive ion etching chamber or in an oxygen asher or through UV-ozone treatment. Oxidation of the patterned functional imprint material produces a hardened, glass-like layer on the patterned surface of the silicon-containing layer. A thickness of the oxidized layer is at least 5 nm. In some cases, a thickness of the oxidized layer is between about 5 nm and about 50 nm, or between about 10 nm and about 30 nm. The elastic modulus of the glass-like oxidized layer exceeds the elastic modulus of the silicon-containing material between the backing and the oxidized layer. Wetting and release properties of the replica template with the oxidized layer may be similar to the wetting and release properties of a fused silica template.

Example 1

Figure 8A:
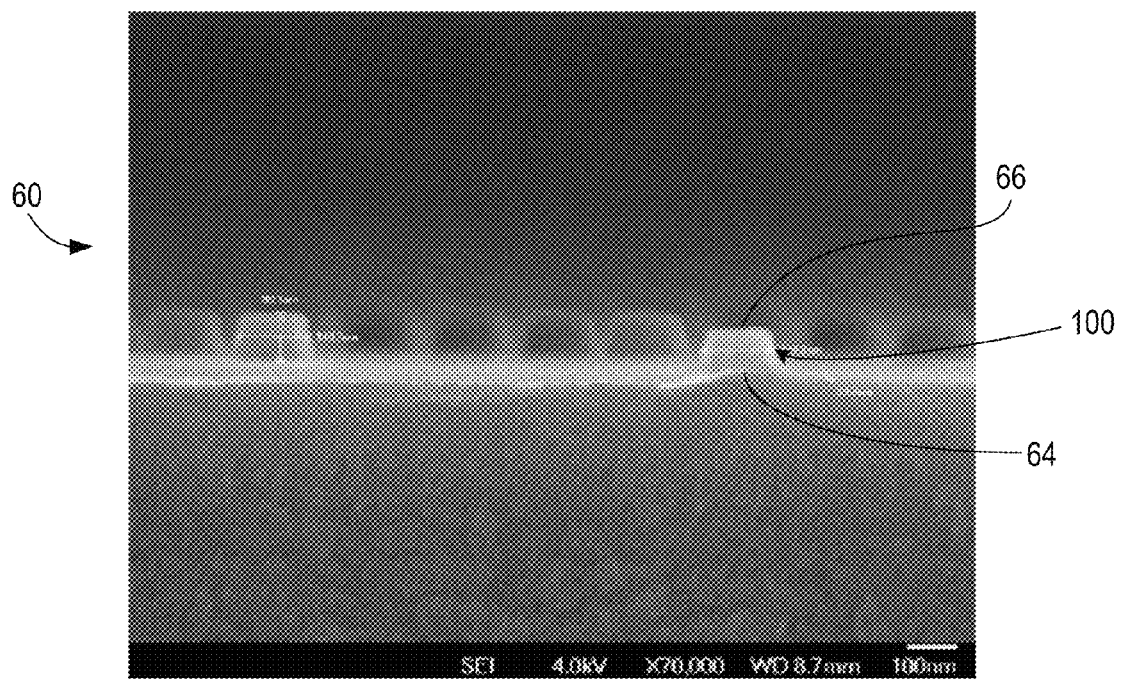
FIGS. 8A-8B show scanning electron micrograph (SEM) images of oxidized functional imprint material on the surface of a patterned layer of a micro-conformal template.
Figure 8B:
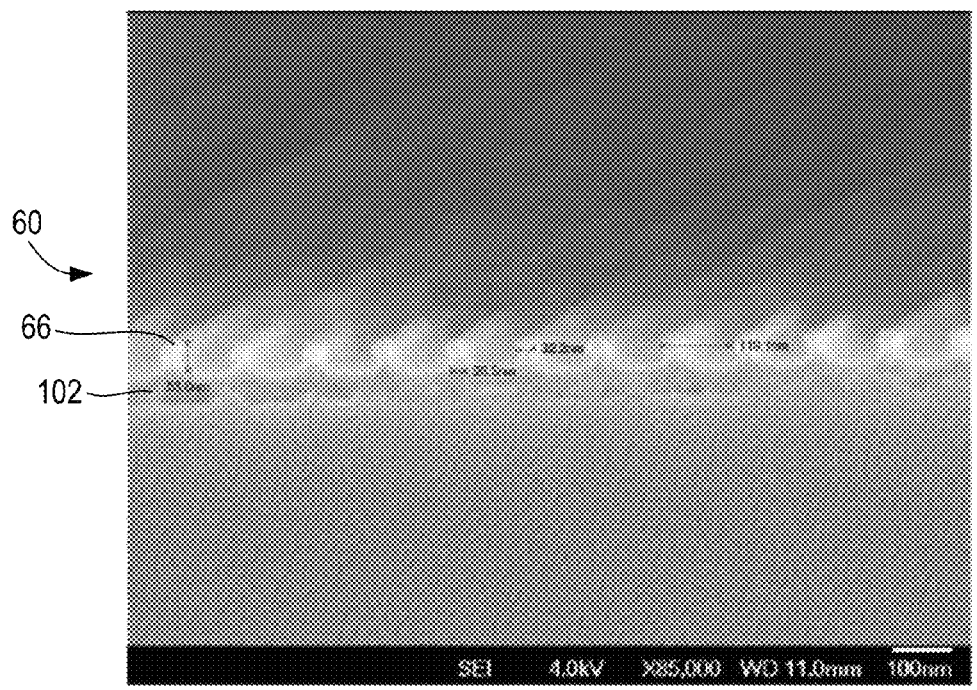

FIGS. 8A and 8B show SEM images of portions of templates 60 formed as described herein with oxidized layer 66 on mold 64. Oxidized layer 66 can be seen as the lighter material in the surface of the mold 64. Oxidized layer 66 has a thickness of less than about 20 nm. FIG. 8A shows oxidized layer 66 on pillars 100 in a pillar pattern formed from an imprint resist including ORMOSTAMP. FIG. 8B shows oxidized layer 66 on ridges 102 of a 120 nm pitch line array pattern formed from an imprint resist including SILMAT. After the formation of oxidized layer 66, template 60 may be loaded onto an automated imprint tool such as the IMPRIO 1100 or IMPRIO 2200. Experiments have shown that the templates exhibit similar release force observed for fused silica templates.

Example 2

FIGS. 9A-9D show SEM images of imprints numbers 2, 52, 124, and 201, respectively, in a series of imprints made a with micro-conformal template to yield patterned layers 106. Images on the left and right of each figure show different pitch regions of the same imprint. The functional imprint material included ORMOSTAMP (available from micro resist technology). The backing layer was 6 μm polycarbonate. Imprints were made using an IMPRIO 1100 and MONOMAT-FT247-100. Comparison of FIGS. 9A-9D indicate substantially unchanged pattern fidelity over the course of the 201 imprints.

Example 3

FIGS. 10A-10D show SEM images of patterned layers 106 formed with a micro-conformal template over glass spheres 108. FIG. 10E shows an SEM image of patterned layer 106 imprinted with the same micro-conformal template over a surface without glass spheres. The 3-μm-diameter glass spheres 108 visible in FIGS. 10A-10D were coated in TRANSPIN by adding <1 wt % glass spheres to TRANSPIN (Molecular Imprints, Inc.), then spin-coated at standard conditions onto the test wafer.

The micro-conformal template was formed by treating a polycarbonate wafer of 150 mm format with an oxygen plasma (March Asher, 300 W, 300 sec) prior to applying a TRANSPIN (Molecular Imprints) adhesion layer. TRANSPIN was coated onto the wafer at 1500 rpm. The wafer was then baked in an oven at 160° C. for 1 minute to cure the TRANSPIN. A solution of 30% ORMOSTAMP and 0.75% FS2000 in PGMEA was dispensed onto the TRANSPIN-coated polycarbonate wafer and spin-coated at 700 rpm for 1 minute. The wafer was then baked in an oven at 120° C. for 8 minutes. The coated wafer was then imprinted on an IMPRIO 1100 configured with a 150 mm substrate chuck using a fused silica pillar tone master template (Quantum 2B, 1 μm pitch). After imprinting, the patterned wafer was post-baked in an oven at 160° C. for 5 minutes to ensure complete cross-linking of the material. The template was then oxidized in a March Asher at 125 W, 120 sec, 400 mTorr, 50 sccm oxygen. The template was then used to imprint over 3-μm-diameter glass spheres 108, as shown in FIGS. 10A-10D.

FIGS. 10A and 10C show top views, and FIGS. 10B and 10D show perspective views after imprinting. FIG. 10E is an image of a patterned resist layer 106 formed with the same template after forming the imprints shown in FIGS. 10A-10D. The images in FIGS. 10A-10D show that the micro-conformal template successfully conforms to the defect on the substrate. That is, the excluded distance 5 from sphere 108 to the patterned layer 106 is less than the diameter of the particle. This example may also include batch processing steps (e.g., with the use of VALMAT), in various automated modes (e.g., with an automated spin-coater or imprinting in an automated mode).

Example 4

Figure 11A:
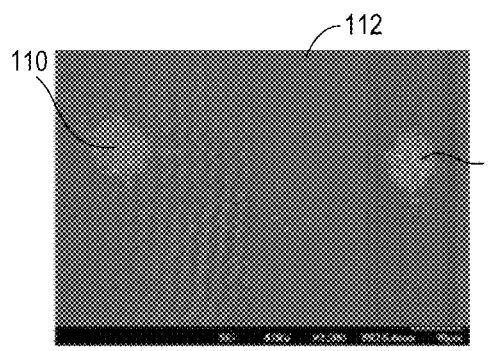
FIGS. 11A-11D show SEM images of discrete track media (DTM) imprints made from a micro-conformal template.
Figure 11B:
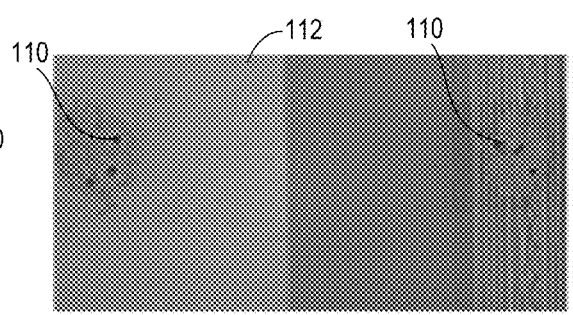
Figure 11C:
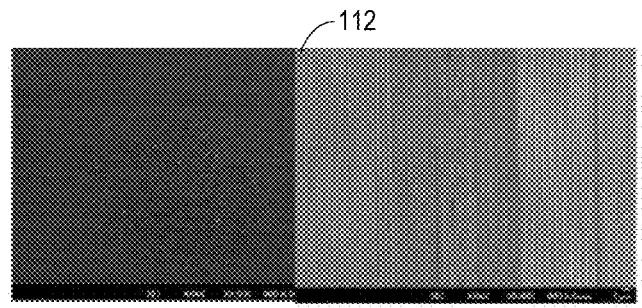
Figure 11D:
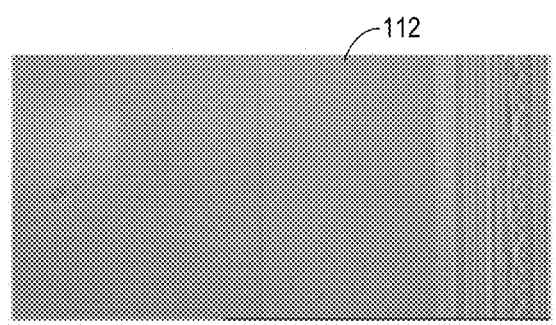

Similar constructions have been used to imprint discrete track media (DTM) patterns as shown in FIGS. 11A-11D and FIG. 12. FIGS. 11A-11D show 120 nm pitch DTM imprints 112 made by a glass backing wafer (525 μm thick) and ORMOSTAMP functional imprint material (2 μm thick) micro-conformal template replica of KIRIN 4-7 (a 120 nm pitch DTM test pattern). Imprints 112 in FIGS. 11A and 11B show particle conforming behavior over clusters of 500 nm glass spheres 110. FIGS. 11C and 11D show imprints 112 with the same template used for the imprints in FIGS. 11A and 11B. The imprints 112 in FIGS. 11C and 11D are made on surfaces without glass particles, and show recovery of the template following the imprints in FIGS. 11A and 11B.

Figure 12:
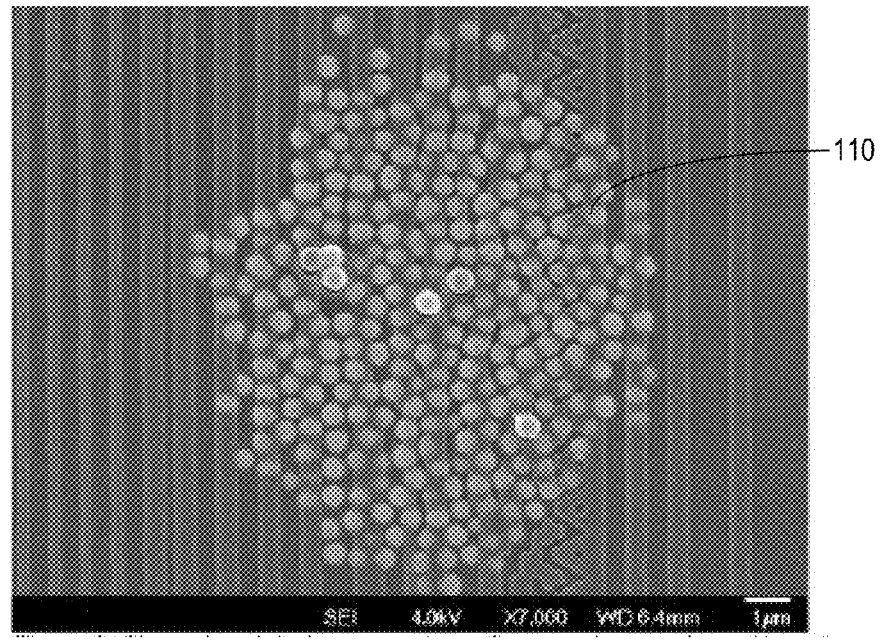
FIG. 12 shows imprinted servo patterns from a micro-conformal template.

FIG. 12 shows imprinted servo patterns for a micro-conformal template construction showing good conforming behavior around 500 nm glass spheres 110.

Figure 13A:
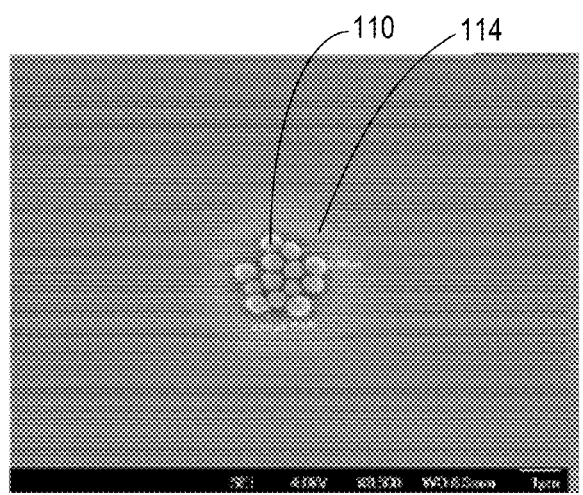
FIGS. 13A-13B shows imprinted DTM lines from a micro-conformal template.
Figure 13B:
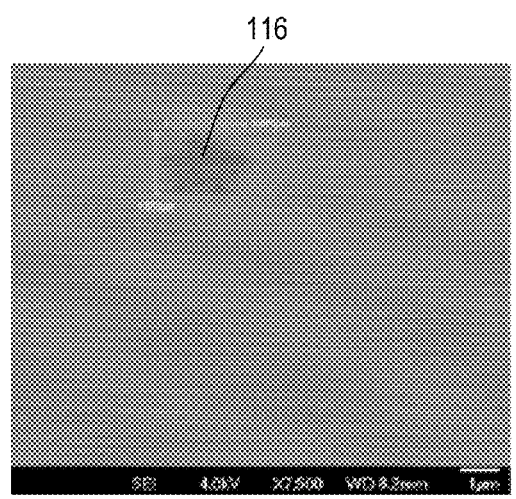

FIG. 13A shows imprinted DTM lines (120 nm pitch) 114 from a micro-conformal template construction showing conforming behavior around 500 nm glass spheres 110. FIG. 13B shows a reduction in defect area 116 in the subsequent imprint made by the same template on a surface without glass spheres, showing recovery of the template.

As seen in FIGS. 11A-11D, FIG. 12, and FIGS. 13A-13B, excluded area in the imprints such that an excluded distance from a defect in a patterned layer formed by the template is less than a height of the defect from an exterior surface of the defect and parallel to the substrate. In addition, the imprinted patterns can be seen running up to and in some cases over the defects. Subsequent imprints on unperturbed substrates show reduced defectivity as compared to the particle-containing imprint.

Example 5

Figure 14:
FIG. 14 shows an SEM image of an imprint made from a micro-conformal template replica of a DTM pattern.

FIG. 14 is an SEM image of an imprint made from a micro-conformal template replica of a 120 nm pitch DTM pattern with SILMAT (ST101-050, available from Molecular Imprints, Inc.) as the functional imprint material. The image shows high fidelity imprinting of DTM lines 114 with a micro-conformal template.

Example 6

Figure 15:
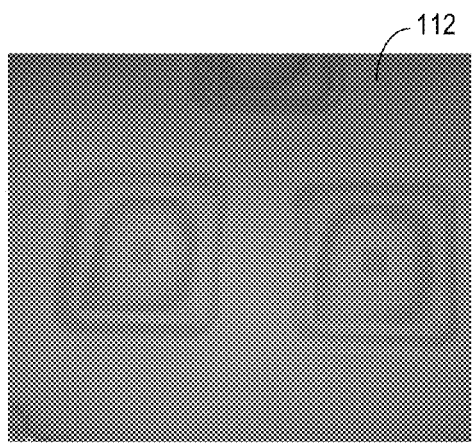
FIG. 15 is an image of imprints formed in a resist including an ORMOCER and a fluorinated surfactant.
Figure 16:
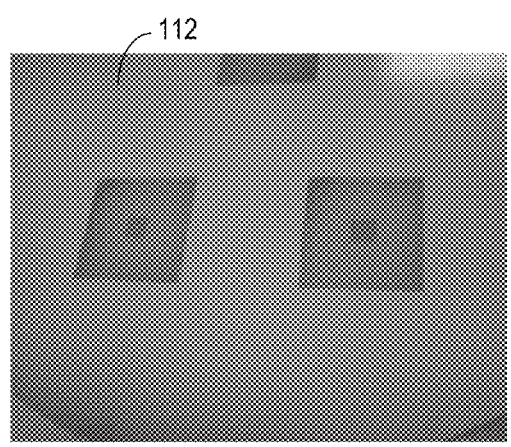
FIG. 16 is an image of imprints from FIG. 15, following development (with isopropyl alcohol) of uncured sol gel.
Figure 17:
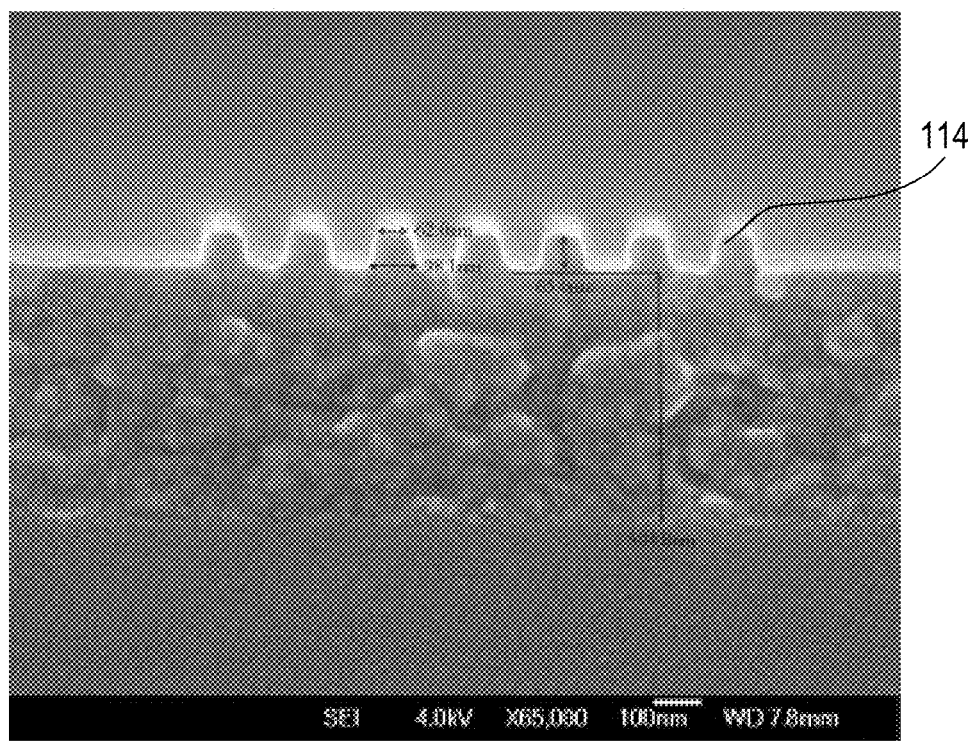
FIG. 17 is an SEM cross section of 60 nm lines from the imprints shown in FIGS. 15 and 16.

FIG. 15 shows imprints 112 made using a fused silica master template containing 60 nm lines and a resist including a 20 wt % solution of ORMOCLAD in methyl n-amyl ketone (MAK) with 0.1 wt % FC4430 fluorinated surfactant added. The resist was spin-coated at 2000 rpm onto a silicon wafer. FIG. 16 shows imprints 112 from FIG. 15 after removal of uncured ORMOCLAD material with isopropyl alcohol. FIG. 17 shows an SEM cross section of 60 nm lines 114 from the imprints shown in FIGS. 15 and 16.

Example 7

Figure 18:
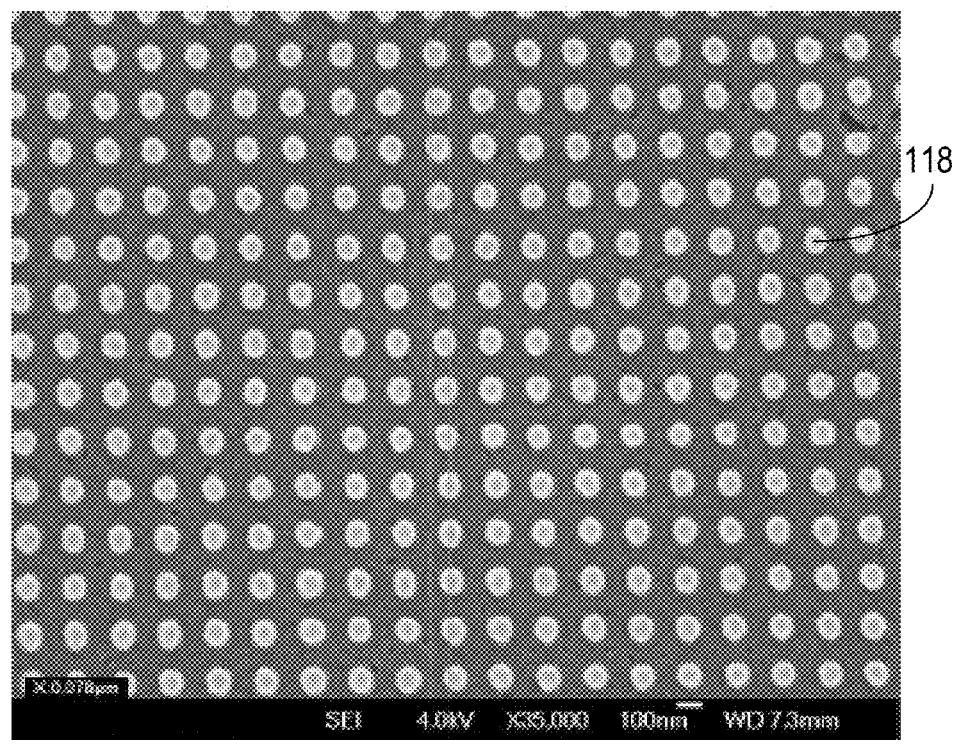
FIG. 18 is an SEM top-down analysis of 80 nm pillars made in ORMOCER imprint resist.

FIG. 18 shows a top-down SEM image of 80 nm pillars 118. The image shows high fidelity imprinting of DTM lines 114 with a micro-conformal template.

Example 8

Figure 19:
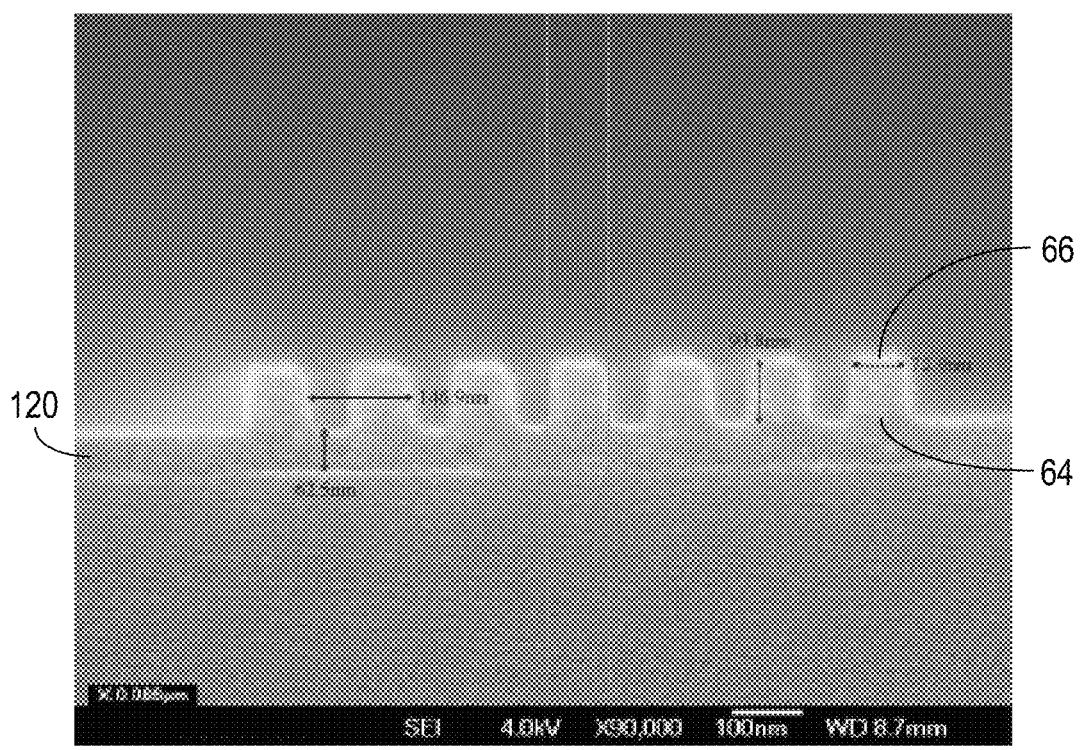
FIG. 19 is an SEM cross-sectional analysis of 70 nm nominal lines, fabricated in resist.

FIG. 19 shows an SEM cross-sectional image of approximately 70 nm lines fabricated using a resist prepared from a 5 wt % ORMOCLAD solution in MAK, containing 0.1 wt % FC4432 fluorinated surfactant, and spin-coated at 2000 rpm. Oxidized layer 66 is visible on mold 64. Residual layer 120 is seen to be relatively uniform over the length of the image.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A nanoimprint lithography template comprising:
   a backing layer;
   a silicon-containing cured nanopatterned resist layer adhered to the backing layer;
   an oxidized layer on the surface of the silicon-containing cured nanopatterned resist layer, wherein the oxidized layer is formed by oxidizing the silicon-containing cured nanopatterned resist layer;
   wherein the elastic modulus of the oxidized layer exceeds the elastic modulus of the silicon-containing cured nanopatterned resist layer, and a thickness of the oxidized layer is at least 5 nm.

2. The nanoimprint lithography template of claim 1, wherein the oxidized layer is formed by oxidizing the silicon-containing cured nanopatterned resist layer via oxygen plasma processing, oxygen ashing, or UV-ozone treatment of the silicon-containing nanopatterned resist layer.

3. The nanoimprint lithography template of claim 1, wherein a silicon content of the silicon-containing cured nanopatterned resist layer is at least about 10 wt %.

4. The nanoimprint lithography template of claim 1, wherein a thickness of the oxidized layer is between about 10 nm and about 30 nm.

5. The nanoimprint lithography template of claim 1, wherein the silicon-containing cured nanopatterned resist layer is formed from a composition comprising a surfactant.

6. The nanoimprint lithography template of claim 5, wherein the surfactant is a fluorinated surfactant.

7. The nanoimprint lithography template of claim 1, wherein the elastic modulus of the backing layer is greater than the elastic modulus of the silicon-containing cured nanopatterned resist layer.

8. The nanoimprint lithography template of claim 1, wherein the silicon-containing cured nanopatterned resist layer comprises an inorganic-organic hybrid polymer.

9. The nanoimprint lithography template of claim 1, wherein the elastic modulus of the silicon-containing cured nanopatterned resist layer is greater than the elastic modulus of polydimethylsiloxane.

10. The nanoimprint lithography template of claim 1, wherein the nanoimprint lithography template shows no reduction in feature fidelity after 200 imprints.

11. The nanoimprint lithography template of claim 1, wherein the nanoimprint lithography template forms a patterned layer in an imprint resist on a substrate having a micron-scale defect, such that an excluded distance from an exterior surface of the micron-scale defect to the patterned layer formed by the nanoimprint lithography template is less than a height of the defect.

12. A nanoimprint lithography method comprising:
    selecting a backing layer;
    disposing a silicon-containing polymerizable material on the backing layer;
    contacting the silicon-containing polymerizable material with a patterned master nanoimprint lithography template;
    solidifying the silicon-containing polymerizable material to form a silicon-containing patterned layer adhered to the backing layer;
    separating the master nanoimprint template from the silicon-containing patterned layer; and
    oxidizing the surface of the silicon-containing patterned layer to form an oxidized layer with a thickness of at least 5 nm on the surface of the silicon-containing patterned layer.

13. The method of claim 12, wherein oxidizing the surface of the silicon-containing patterned layer comprises an oxidizing treatment selected from the group consisting of oxygen plasma processing, oxygen ashing, reactive ion etching, and UV-ozone treatment.

14. The method of claim 12, wherein a silicon content of the silicon-containing polymerizable material is at least about 10 wt %.

15. The method of claim 12, wherein the silicon-containing polymerizable material comprises a fluorinated surfactant.

16. The method of claim 12, wherein the elastic modulus of the backing layer is greater than the elastic modulus of the silicon-containing patterned layer.

17. The method of claim 12, wherein the silicon-containing patterned layer comprises an inorganic-organic hybrid polymer.

18. A nanoimprint lithography template comprising:
a backing layer; and
a silicon-containing cured nanopatterned resist layer adhered to the backing layer, wherein the silicon-containing cured nanopatterned resist layer comprises an oxidized surface formed by oxidizing the silicon-containing cured nanopatterned resist layer, and the elastic modulus of the backing layer exceeds the elastic modulus of the silicon-containing cured nanopatterned resist layer,
wherein the nanoimprint lithography template forms a patterned layer from an imprint resist on a substrate, the substrate having a micron-scale defect, such that an excluded distance from an exterior surface of the micron-scale defect to the patterned layer formed by the nanoimprint lithography template is less than a height of the defect, and wherein the nanoimprint lithography template shows no reduction in feature fidelity after multiple imprints.

19. The nanoimprint lithography template of claim 1, wherein the elastic modulus of the silicon-containing cured nanopatterned resist layer is greater than about 5 MPa.

20. The nanoimprint lithography template of claim 1, wherein the silicon-containing cured nanopatterned resist layer is free of polydimethylsiloxane.

* * * * *